United States Patent
Chan et al.

(10) Patent No.: US 7,095,340 B2
(45) Date of Patent: Aug. 22, 2006

(54) RUN-LENGTH VIOLATION DETECTION CIRCUITRY AND METHODS FOR USING THE SAME

(75) Inventors: Vinson Chan, Fremont, CA (US); Chong Lee, San Ramon, CA (US); Huy Ngo, Redwood City, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/087,217

(22) Filed: Mar. 22, 2005

(65) Prior Publication Data

US 2005/0162289 A1     Jul. 28, 2005

Related U.S. Application Data

(63) Continuation of application No. 10/652,907, filed on Aug. 28, 2003, now Pat. No. 6,888,480.

(51) Int. Cl.
*H03M 7/00*     (2006.01)
(52) U.S. Cl. ........................... 341/59; 360/40; 713/500
(58) Field of Classification Search ................ 341/59; 360/40; 713/500; 714/765
See application file for complete search history.

(56) References Cited

U.S. PATENT DOCUMENTS

| | | | | |
|---|---|---|---|---|
| 4,486,739 A | * | 12/1984 | Franaszek et al. ............ 341/59 |
| 5,216,677 A | * | 6/1993 | Takagi et al. ................ 714/765 |
| 6,081,395 A | * | 6/2000 | Shin ............................. 360/40 |
| 6,389,548 B1 | * | 5/2002 | Bowles ........................ 713/500 |

OTHER PUBLICATIONS

Pozidis et al. (U.S. Appl. No. 10/140,508), "Signal processor and apparatus for reproducing information", filed on May 7, 2002.*
Yokose (U.S. Appl. No. 10/370,561), "Image Processing Apparatus", filed on Feb. 24, 2003.*
Aung et al. (U.S. Appl. No. 09/805,843), "Clock Data Recovery Circuitry associated with programmable logic device circuitry", filed on Mar. 31, 2001.*

* cited by examiner

*Primary Examiner*—Jean Bruner Jeanglaude
(74) *Attorney, Agent, or Firm*—Fish & Neave IP Group of Ropes & Gray LLP

(57) ABSTRACT

Circuitry for detecting excessive runs of similar bits of data in a data stream is provided. The data stream is typically received as serial data operating in a serial clock domain. Run-length detection circuitry checks the received data for run-length violations while operating in a slower parallel clock domain, as opposed to the faster serial clock domain. An advantage of operating run-length detection circuitry in the parallel domain is that longer length run-length violations can be searched for in the received data, as compared to run-length detectors that operate in the serial domain. Another advantage offered by the circuitry is that the run-length violation signal can be provided to utilization circuitry asynchronously. This enables utilization circuitry to quickly capture the signal despite differences in clock domains (i.e., the clock domain of the detection circuitry and the clock domain of the utilization circuitry).

13 Claims, 6 Drawing Sheets

RUN-LENGTH VIOLATION DETECTION CIRCUITRY AND METHODS FOR USING THE SAME

This is a continuation of U.S. patent application Ser. No. 10/652,907, filed Aug. 28, 2003, now U.S. Pat. No. 6,888,480, which is hereby incorporated by reference herein in its entirety.

BACKGROUND OF THE INVENTION

This invention relates to data communication, and more particularly to circuitry for receiving data signals that have been communicated from a data signal source.

Data is frequently transmitted serially. The serial data typically takes the form of a logic HIGH or a logic LOW as it is being transmitted. As such, the data can be transmitted as a series of zeros and ones to represent bytes of information that are being transmitted one after another. Typically, transmission of serial data can occur at relatively high speed (e.g., on the order of gigahertz). High-speed serial interface (HSSI) applications is one example that uses high speed serial transmission.

It is known that prolonged runs of a logic HIGH or logic LOW signal can cause problems in data communication. For example, DC biasing is a common problem resulting from long runs of a logic LOW or HIGH signal. DC biasing can cause the average voltage of the serial data to exhibit the voltage of the logic signal that is being repeated. This can lead to intersignal interference because a transition in the received data (e.g., a transition from a repeating logic state to the non-repeating logic state and back to the repeating logic state) may be missed. Thus, it is desirable to minimize occurrences of long runs of a particular logic state.

Run-length detection circuitry has been developed to detect occurrences of runs of a particular length. In general, run-length detection circuitry compares the number of consecutive ones or zeros received as serial data to a programmable run-length violation parameter. This parameter can be set, for example, by a multi-bit control input programmed by a user. During operation, a run-length violation signal is generated when the run length of received data exceeds the run-length violation parameter. This run-length violation signal may trigger utilization circuitry (e.g., a programmable logic device) to, for example, ignore incoming data, initiate a restart in data reception, or perform some other error control function.

Utilization circuitry is typically circuitry that processes the received data by, for example, performing logic operations. Because utilization circuitry is processing the received data, it is preferable to check the incoming data for run-length violations before it is received by the utilization circuitry. Therefore, run-length detection circuitry generally checks the data for run-length violations before it is received by the utilization circuitry. In some applications, run-length detection circuitry is part of dedicated circuitry (e.g., receiving circuitry) that conditions the serial data signal before it reaches the utilization circuitry. The dedicated circuitry can condition the data by, for example, deseriallizing the serial data and dividing down the clocking frequency of the serially transmitted data to a deserialized (slower) clocking frequency. This deseriallization is one source that creates the presence of a different clock domain (i.e., a parallel and a serial clock domain). In fact, several different clock domains may be present in the dedicated circuitry and utilization circuitry.

Previous run-length detection circuitry has operated in the serial clock domain. That is, it used the clocking frequency of serial data to detect runs in data being transmitted to the dedicated circuitry (e.g., receiving circuitry) and/or utilization circuitry. Operating run-length detection circuitry in the serial domain places several stringent design and operational requirements on the detection circuitry. For example, because there is other circuitry operates at a slower clocking frequency (e.g., a deserialized or parallel clocking frequency), the detection circuitry has to generate a run-length violation signal that can be detected by the circuitry operating in the slower clock domain. That is, the run-length violation signal may be asserted according to a predetermined number of serial domain clock cycles, but the signal may not be asserted long enough for the utilization circuitry to detect it. Thus the presence of multiple clock domains puts several design limitations on existing run-length detection circuitry, especially since serial clocking frequencies continue to increase.

Another problem with run-length detectors operating in the serial domain is that detection of runs becomes more difficult and unreliable as the length of the runs increase.

Therefore, it is an object of this invention to operate run-length violation circuitry in a slower, non-serial, clock domain.

It is also an object of this invention to asynchronously assert a run-length violation signal to ensure that utilization circuitry captures the asserted violation signal, despite the presence of multiple clock domains.

SUMMARY OF THE INVENTION

Run-length detection circuitry in accordance with this invention typically includes a data input, a clock input, a run-length count input that indicates a run-length violation parameter that will prompt the circuitry to provide a run-length violation signal to utilization circuitry asynchronously if such a run-length is detected in the received data. The run-length detection circuitry of the invention operates in a slower parallel clock domain, as opposed to a faster operating serial clock domain. Operating in the slower parallel clock domain advantageously enables the circuitry of the invention to detect longer run-lengths than run-length detectors operating in the serial clock domain. Another advantage realized by operating in the parallel domain is that it eliminates stringent design constraints previously required of run-length detection circuitry operating in the serial domain.

Circuitry of this invention asynchronously provides a run-length violation signal to utilization circuitry (e.g., a programmable logic device). That is, the run-length violation signal is provided to utilization circuitry independent of the presence of multiple clock domains. This eliminates problems associated with differences in the clocking frequency between, for example, utilization circuitry and dedicated circuitry. To further ensure that utilization circuitry detects assertion of a run-length violation signal, the circuitry of the invention can assert the run-length violation signal for at least two parallel clock cycles.

Another advantage of this invention is that it can be programmed to detect run-lengths of different length based on the width of the data path and a selected multiplication factor. For example, the run-length violation can be the product of the data path width times a selected multiplication factor. This arrangement obviates a need for a multi-bit input that defines the run-length violation parameter.

Further features of the invention, its nature and various advantages will be more apparent from the accompanying drawings and the following detailed description.

DETAILED DESCRIPTION

Figure 1:
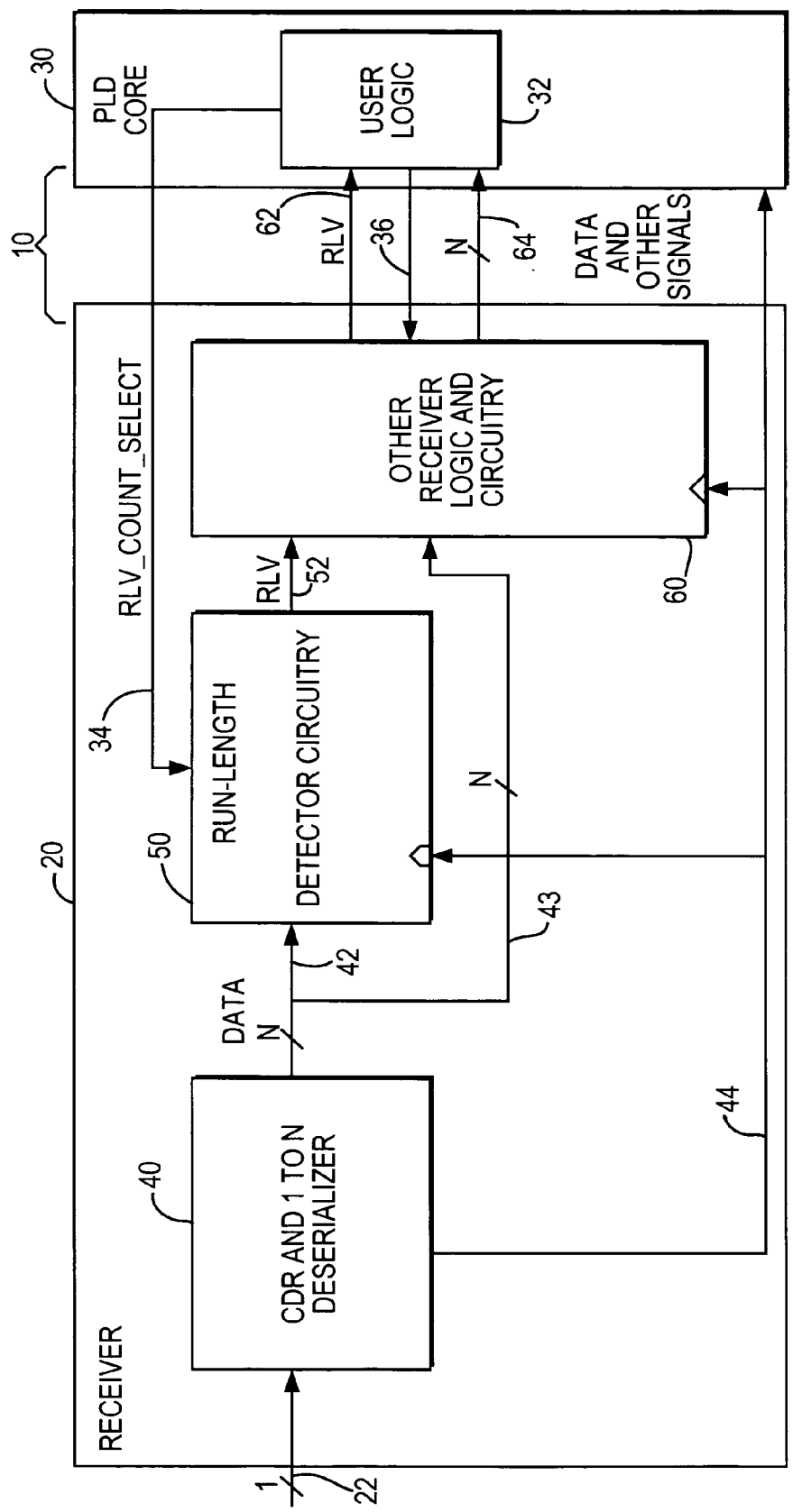
FIG. 1 is a simplified schematic block diagram of an illustrative embodiment of circuitry in accordance with the invention.

The illustrative embodiment shown in FIG. 1 is in the context of programmable logic device ("PLD") circuitry 10 that includes receiver circuitry 20 and PLD core circuitry 30. PLD 10 is typically (although not necessarily) a single integrated circuit. (Alternatively, circuitry 10 could be, for example, a multi-chip module including two or more separate integrated circuits.) The illustrative context shown in FIG. 1 is by no means the only possible context. For example, instead of being used with PLD circuitry (like 30), receiver circuitry 20 could instead be used with many other types of utilization circuitry such as microprocessor circuitry. Many other possible contexts for the invention will occur to those skilled in the art having the benefit of the disclosure contained in this specification. The following description (e.g., of FIG. 1, etc.) will therefore be understood to be illustrative and not limiting.

Receiver 20 receives a serial bit stream signal via lead 22. This signal is applied to clock data recovery ("CDR") and 1 to N deserializer circuitry 40 in receiver circuitry 20. Use of CDR-type signaling (in which data information and clock information are combined in one signal) is optional. Other types of serial data signaling can be used instead, if desired. Even deserialization is optional. But assuming that circuitry-40-types of signal processing are employed, more information about illustrative suitable circuitry and components for doing these types of signal processing can be found in such references as Aung et al. U.S. publication No. 20010033188-A1, Lee et al. U.S. Pat. No. 6,650,140, Venkata et al. U.S. Pat. No. 6,750,675, and Venkata et al. U.S. patent application Ser. No. 10/273,899, filed Oct. 16, 2002. It is not believed that the material in these references is essential for understanding and/or practicing any aspect of the present invention. But if additional information is desired or needed for any purpose, it is available from one or more of these references.

CDR circuitry 40 recovers from the incoming serial data a recovered clock signal and a recovered (or retimed) serial data signal. The deserializer portion of circuitry 40 converts the recovered (or retimed) serial data signal to a plurality N of parallel data signals on leads 42 and 43. N is typically the number of bits in a byte, but this is not absolutely necessary; and in any event, the N signals on leads 42 and 43 are typically of the width of the data path implemented by circuitry 10. Circuitry 40 also outputs a clock signal on lead 44 that is typically derived from the recovered clock signal and synchronized with the data on leads 42 and 43. For example, assuming that the number of leads 42 and 43 is equal to the number of bits in a byte, the clock signal on lead 44 typically has frequency equal to the byte rate of the system. That is, the frequency is equal to the clock associated with the serial data received by the CDR circuitry 40 divided by the number of bits in the byte. The signal on lead 44 may therefore be referred to as a "byte rate clock," a "deserialized clock," or a "slow speed parallel clock." The signal on lead 44 may be the clock signal which provides the non-serial clock domain in which the circuitry of this invention operates.

The signals on leads 42 are applied to run-length detector circuitry 50. This circuitry also receives (1) the clock signal on lead 44 and (2) a RLV_COUNT_SELECT on lead 34 from user logic circuitry 32 in PLD core 30. The RLV_COUNT_SELECT signal selects the length of the run-length violation parameter that circuitry 50 searches for when checking the incoming data on leads 42 for run-length violations. The run-length violation parameter can be specific or granular. A specific run-length violation parameter is set by a multi-bit number that is transmitted on the RLV_COUNT_SELECT signal. For example, the RLV_COUNT_SELECT signal could select a parameter of 24. A granular run-length violation parameter is set by multiplying the width of the data path (e.g., leads 42) times a selected multiplication factor. For example, assuming that the data path is 8 bits and the selected multiplication factor is 5, the count is 40. The granular run-length violation parameter is discussed below in more detail in connection with FIG. 3.

Circuitry 50 processes N bits of data per parallel clock cycle and uses state machines and other circuitry to keep a running total of the run-length detected in the received data. The state machines enable circuitry 50 to detect run lengths spanning one or more clock cycles (e.g., parallel clock cycles). For example, a run-length can begin in a first clock cycle, carry-on through a second clock cycle, and end in a third clock cycle. Circuitry 50 aggregates the continuous running length in each of these clock cycles and checks to see if the running total equals or exceeds the run-length violation parameter. If the running total equals or exceeds the run-length violation parameter selected by the RLV_COUNT_SELECT signal, circuitry 50 asserts a run-length violation signal (sometimes referred to herein as the RLV_SIGNAL) on lead 52. The run-length violation signal is provided to utilization circuitry asynchronously so that the utilization circuitry can capture the signal despite the presence of the different time domains. A more detailed explanation of the operation of circuitry 50 is discussed below in connection with FIG. 2.

The RLV_SIGNAL is asynchronously provided on lead 52 so that user logic 32 can receive the signal substantially immediately. In fact, the RLV_SIGNAL signal may bypass other receiver logic and circuitry 60 altogether as it is provided to user logic 32. In addition, the RLV_SIGNAL it can be asserted for a predetermined period of time (e.g., two or three parallel clock cycles). By asserting the RLV_SIGNAL for a predetermined period of time, this can assure that user logic 32 will see the RLV_SIGNAL, despite the presence of different clock domains (e.g., the parallel clock domain of circuitry 50 is different than the clock domain of user logic 32). In addition, the prolonged assertion of the RLV_SIGNAL ensures that user logic 32 has sufficient time to perform an action (e.g., reset circuitry 20) when the RLV_SIGNAL is received.

Run-length detector circuitry 50 can operate to continuously detect run-lengths of the incoming data signal. If desired, circuitry 50 can be enabled or disabled based on the assertion of an enable signal (not shown). Such an enable signal can be provided by, for example, user logic 32.

PLD 10 can include circuitry 60. Circuitry 60 may perform various conventional or previously disclosed operations on data provided on leads 43 in preparation for passing that data on to user logic 32. Such operations may include any or all of eight-bit-to-ten-bit decoding, decryption, clock rate matching, phase compensation, channel deskew, and/or the like. Circuitry 60 outputs data and other signals on leads 64 to user logic 32. In addition, circuitry 60 may receive control signals 36 from user logic 32. If desired, circuitry 60 can receive the RLV_SIGNAL, process the RLV_SIGNAL, and pass it to user logic 32. If circuitry 60 does receive the RLV_SIGNAL, it is transmitted to user logic 32 on lead 62. The several references mentioned earlier in this specification provide more information about several types of operations that may be performed by circuitry 60. On the other hand, the presence of circuitry 60 is entirely optional, and it can be completely omitted if desired. If circuitry 60 is omitted, the outputs of circuitry 50 may be applied directly or substantially directly to user logic 32.

Figure 2:
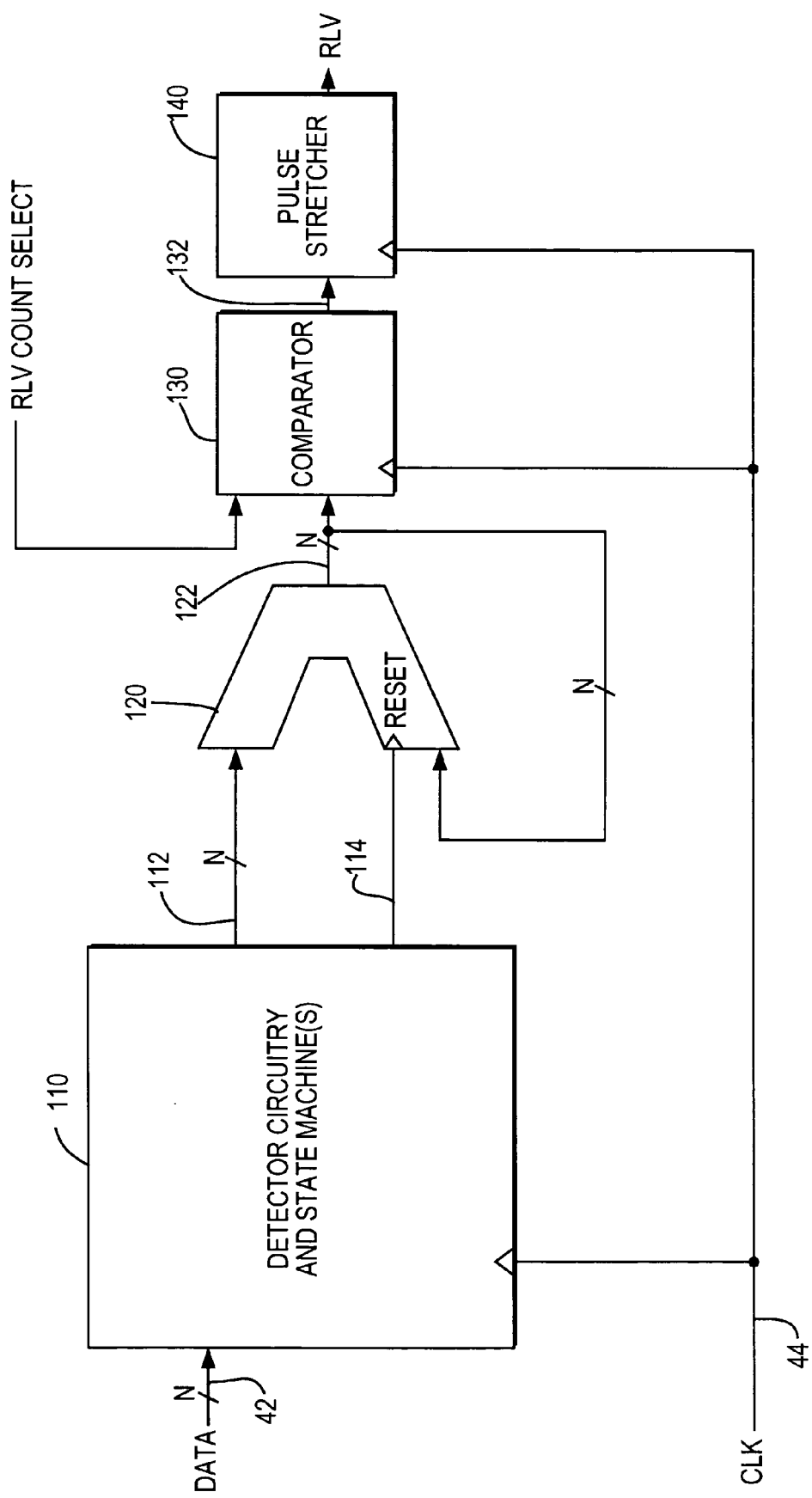
FIG. 2 is a more detailed, but still simplified, schematic block diagram of an illustrative embodiment of a portion of the circuitry of FIG. 1 in accordance with the invention.

FIG. 2 is a more detailed, but still simplified block diagram of run-length detection circuitry 50 of FIG. 1 in accordance with the invention. As shown in FIG. 2, circuitry 50 includes detector circuitry 110, adder circuitry 120, comparator 130, and pulse stretcher circuitry 140. [0028] Detector circuitry 110 receives deserialized data on leads 42 and the parallel clock signal on lead 44 from circuitry 40 (not shown). Each clock cycle, detector circuitry 110 receives N bits of data, where N represents the number of bits received in parallel on leads 42. During each clock cycle, circuitry 110 generates a run-length count based on the data received during that clock cycle and provides that count to adder circuitry 120 on leads 112. Detector circuitry 110 can utilize state machines to determine the number of consecutive ones or zeros that are received each clock cycle. The state machine can be implemented in circuitry 110, user logic 32, or both. An example is described below to illustrate how circuitry 110 and adder circuitry 120 operate in conjunction with each other to keep track of run-lengths that span more than one clock cycle. But before the example is discussed, adder circuitry 120 is described first.

Adder circuitry 120 is a feedback adder that sums the output of circuitry 120 with the output of detector circuitry 110 provided on leads 122. As shown, the output of adder circuitry 120 is fed back to one of its inputs. The feedback arrangement of circuitry 120 enables circuitry 100 to aggregate run lengths spanning one or more consecutive clock cycles. Thus, the output of adder circuitry 120 at any given time is the running total of the run-length detected in the received data. It is this output (the output of adder circuitry 120) that is compared to a run-length violation parameter in comparator 130 to determine whether a run-length violation has occurred. Adder circuitry 120 can be reset (i.e., clears the output) by receiving a RESET signal from detector circuitry 110 on lead 114. Adder circuitry 120 may be reset when the state machine of circuitry 110 detects a transition in the received data. A transition marks a break in the run-length, thereby resetting the run-length back to zero.

The following is an example illustrating how detector circuitry 110 and adder circuitry 120 operate in conjunction with each other to count the run-length of the received data. First, assume that the data "01010000" is received in a first clock cycle. When processing this data, the state machine causes detector circuitry 110 to output a 4, indicating that a run-length of 4 was detected in this clock cycle. This run-length count is provided to adder circuitry 120. Adder circuitry adds this 4 to its current output (e.g., in this case, the output is assumed to be zero, resulting in an output of 4).

Second, assume that the data "00000000" is received in a second clock cycle. After the state machine processes this data, it causes detector circuitry 110 to output an 8 to adder circuitry 120. Because the data received in the second clock cycle did not have any transitions (e.g., a one-to-zero transition), the state machine did not reset adder circuitry 120. In addition, the state machinery does not reset the total run-length summed in adder circuitry 120 because the first data bit received in the second clock cycle has the same logic state as the last bit in the first clock cycle. Adder circuitry 120 sums the 8 with the its own output, 4, yielding a total run-length count of 12 after two clock cycles. If, by way of further example, there was a transition between the last bit in the first clock cycle and the first bit of the second clock cycle, then adder circuitry 120 would have been reset.

Finally, assume that the data "01011010" is received by detector circuitry 110 in a third clock cycle. When the state machine processes this received data, circuitry 110 sends a RESET signal to adder circuitry 120 because the state machine detects a transition in the received data. This RESET signal zeros the output of adder circuitry 120, causing it to output a 0 (logic LOW). After the state machine finishes processing the data it causes detector circuitry 110 to output a 1 (logic HIGH). The output of adder circuitry 120 is now 1. The output is 1 because the output of adder circuitry 120 was reset when the state machine detected a transition in the data received in the third clock cycle. As by way of further example, if the data received during the third clock cycle was "01011011," then detector circuitry 110 would output a 2, and the output of adder circuitry 120 would also be 2.

Comparator 130 receives the output of adder circuitry 120 via leads 122 and also receives RLV_COUNT_SELECT. As discussed above, RLV_COUNT_SELECT sets the run-length violation parameter needed to trigger assertion of a run-length violation signal. Comparator 130 compares the output of adder circuitry 120 to the selected run-length violation parameter. When the output of adder circuitry 122 equals or exceeds the selected run-length count parameter, comparator 130 asserts a run-length violation signal to indicate that a run-length violation has occurred. Comparator 130 may continue to assert the run-length violation signal until there is a transition in the received data.

One advantage of the invention is that comparator 130 applies the run-length violation signal to user logic 32 (of FIG. 1) asynchronously. Asynchronous application of the run-length violation signal avoids potential issues related to delays in signal propagation and system latency. It also ensures that user logic 32 captures the run-length violation signal, even though user logic 32 may be operating in a clock domain different than that of receiver 20. To further ensure that user logic 32 or other utilization circuitry receives the run-length violation signal, pulse stretcher circuitry 140 may be provided.

Pulse stretcher circuitry 140 receives the output of comparator circuitry 130 via lead 132. Pulse stretcher circuitry 140 prolongs assertion of the run-length violation signal so that it remains asserted for at least two parallel clock cycles, even though comparator 130 may no longer be asserting the signal. By prolonging the assertion of the run-length violation signal, this ensures that PLD circuitry 30 has adequate time to capture the run-length violation signal. In addition, prolonged assertion of the signal also insures that PLD circuitry 30 has adequate time to perform an action (e.g., error control function). Note that those of skill in the art will appreciate that pulse stretcher circuitry can be constructed from a series of flip-flops connected in series, with each additional flip-flop, prolonging assertion of the signal.

The run-length violation parameter used by comparator 130 to determine whether a run length violation has occurred is programmable. In one embodiment, comparator 130 may have a multi-bit input that selects the run-length violation parameter. For example, a six-bit input enables a user to select a run-length count ranging between 1 and 64 bits in length.

Figure 3:
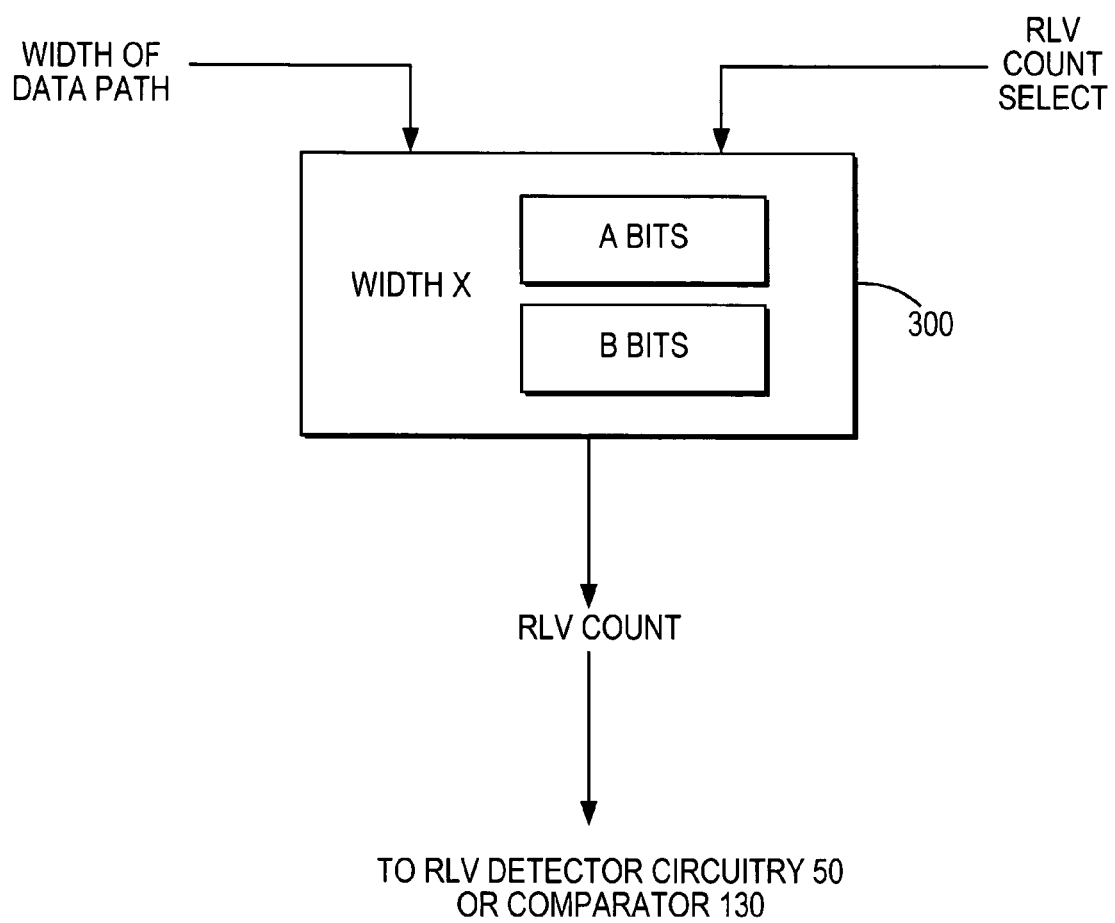
FIG. 3 is a simplified block diagram of an illustrative embodiment of circuitry for use in defining a run-length violation parameter in accordance with the invention.

FIG. 3 shows circuitry 300 that uses an alternative implementation to using multi-bit inputs to select run-length violation parameters. One advantage of using circuitry 300 is that it uses less area than its multi-bit counterpart to achieve selection of a run-length violation parameter. In general, circuitry 300 generates a run-length violation parameter by multiplying the width of the data path (e.g., the width of leads 42) used for transmitting the deserialized data times a predetermined number that is selected based on the received RLV_COUNT_SELECT signal. Note that use of circuitry 300 is advantageously made possible because it operates in the slower speed parallel clock domain, as opposed to the faster speed serial clock domain.

As illustrated in FIG. 3, circuitry 300 receives the width of the data path and the RLV_COUNT_SELECT signal. The width input can be, for example, provided by user logic 32 or it can be hard-wired to circuitry 300. Circuitry 300 includes at least two predetermined multiplication factors. Note that the number of multiplication factors used in circuitry 300 is not fixed and is largely a matter of design choice. The predetermined multiplication factors are shown as A and B, where A and B each represent an integer. The RLV_COUNT_SELECT signal selects which one of the multiplication factors is used. The selected multiplication factor is multiplied times the width of the data path to generate the run-length count parameter. To further explain the operation of circuitry 300, consider the following example.

Assume that multiplication factors A and B are 4 and 5, respectively and that the width of the data path is 8. If the RLV_COUNT_SELECT selects factor A, then the run-length violation count is 32. Alternatively, if the RLV_COUNT_SELECT selects factor B, then the run-length violation count is 40.

If desired, the RLV_COUNT_SELECT can select a multiplication factor based on the width of the data path. For example, if the data path width is 8 bits, factor A may be selected. On the other hand, if the data path width is 10 bits, factor B may be selected.

Figure 4A:
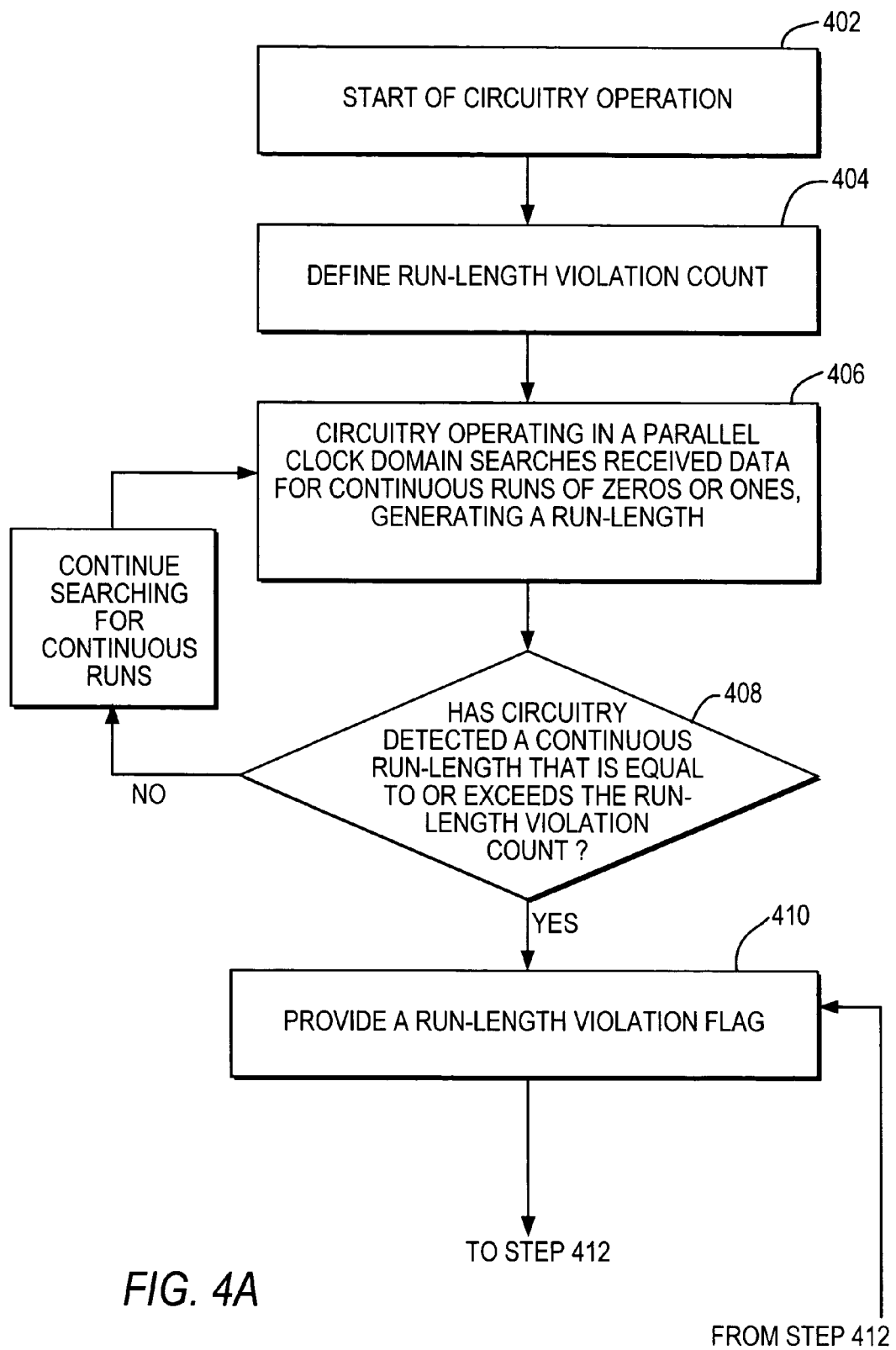
FIGS. 4a and 4b are collectively a simplified flow chart of illustrative modes of operation of circuitry of the type shown in FIGS. 1 and 2 in accordance with the invention.
Figure 4B:
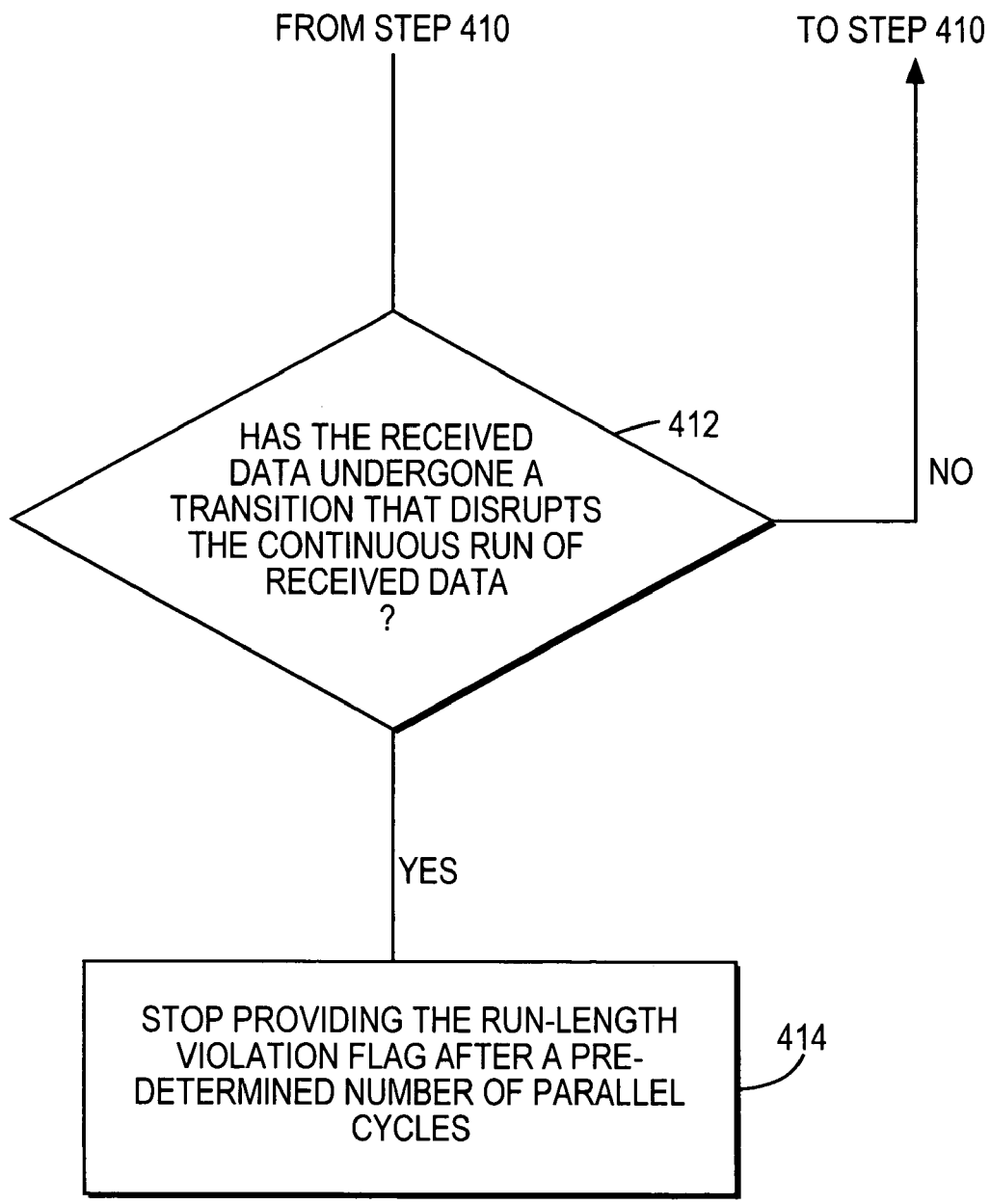

FIGS. 4a and 4b collectively show an illustrative process of operating circuitry in accordance with the invention. The process starts at step 402, which indicates the start of operation of the circuitry (e.g., circuitry is activated). In step 404, the circuitry 50 (FIG. 1) receives a RLV_COUNT_SELECT signal, which is used to define the run-length violation parameter. As discussed above, the run-length violation parameter is the minimum run-length that needs to be detected by circuitry 50 before a run-length violation signal is asserted.

At step 406, circuitry searches the data provided on leads 42 (FIGS. 1 and 2) for continuous runs of zeros and ones, while operating in the parallel clock domain. At step 408, the circuitry determines if the run-length is equal to or exceeds the run-length violation parameter. If the run-length does not equal or exceed the run-length violation count, then the process loops back to step 406. However, if the run-length equals or exceeds the run-length violation count, the process proceeds to step 410.

Step 410 asynchronously asserts a run-length violation signal, indicating that circuitry 50 has detected a run-length that equals or surpasses the run-length violation parameter. Step 410 continues to assert this signal until step 412 detects a transition in the received data. As shown, the process returns to step 410 until this transition is detected. If a transition is detected, then the process proceeds to step 414. Step 414 continues to assert the run-length violation signal for a predetermined number of parallel clock cycles even though a transition has been detected in the received data and the run-length has been reset to zero. Once those predetermined number of parallel clock cycles elapse, the run-length flag is deasserted.

Note that the steps shown in FIG. 4 are merely illustrative and that additional steps may be added or some of the steps may be deleted.

Figure 5:
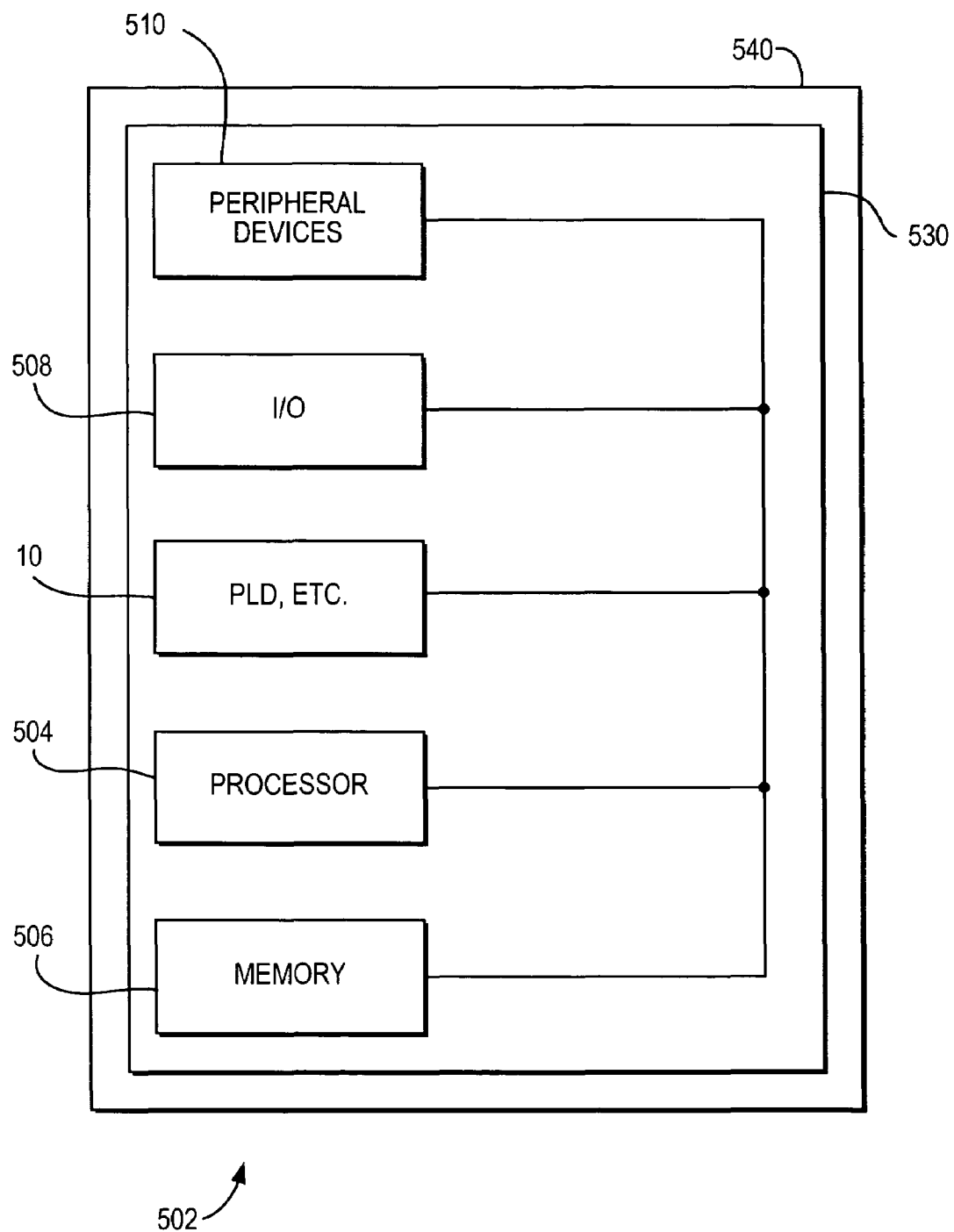
FIG. 5 is a simplified block diagram of an illustrative system employing circuitry in accordance with the invention.

FIG. 5 illustrates possible use of circuitry 10 of the type shown in FIG. 1 in a data processing system 502 in accordance with the invention. Data processing system 502 may include one or more of the following components: a processor 504, a memory 506, I/O circuitry 508, and peripheral devices 510. These components are coupled together by a system bus or other interconnections 520 and are populated on a circuit board 530 (e.g., a printed circuit board) that is contained in an end-user system 540. Communication among the various components shown in FIG. 5 and/or with external circuitry may be of the type described above in connection with FIG. 1 to any desired extent. As an addition or alternative to use of the circuitry 10 of this invention in a more or less stand-alone component 10 in FIG. 5, such circuitry may also or alternatively be provided as communication interface circuitry in any of the other components 504, 506, 508, and 510.

System 502 can be used in a wide variety of applications, such as computer networking, data networking, instrumentation, video processing, digital signal processing, or any other application where the advantage of using programmable or reprogrammable logic is desirable. Circuitry 10 (including programmable logic circuitry 30 as in FIG. 1) can be used to perform a variety of different logic functions. For example, circuitry 10 can be configured as a processor or controller that works in cooperation with the determination 504. Circuitry 10 may also be used as an arbiter for arbitrating access to a shared resource in system 502. In yet another example, circuitry 10 can be configured as an interface between processor 504 and one of the other components of system 502. It should be noted that system 502 is only exemplary, and that the true scope and spirit of the invention should be indicated by the following claims.

It will be understood that the foregoing is only illustrative of the principles of the invention and that various modifications can be made by those skilled in the art without departing from the scope and spirit of the invention.

What is claimed is:

1. Run-length detection circuitry that operates in a parallel clock domain, the circuitry comprising:
   a data input for receiving a plurality of bits in parallel each cycle of a parallel clock signal;
   a clock input for receiving the parallel clock signal;
   a run-length selection input indicating a run-length violation parameter that needs to be matched or exceeded in order to cause the run-length detection circuitry to assert a run-length violation signal; and an output, the run-length violation circuitry processing the received bits over one or more parallel clock cycles to determine whether to assert the run-length violation signal and provide it to the output.

2. A digital processing system comprising:

processing circuitry;

a memory coupled to the processing circuitry; and run-length circuitry as defined in claim 1 coupled to the processing circuitry and the memory.

3. The circuitry defined in claim 1 wherein the run-length violation signal is provided to the output asynchronously.

4. The circuitry defined in claim 1 wherein the parallel clock signal is derived from a serial clock signal.

5. The circuitry defined in claim 1 wherein the run-length violation parameter is selected from at least two predetermined run-length violation parameters.

6. The circuitry defined in claim 1, wherein the run-length violation signal is asserted for at least two clock cycles of the parallel clock signal.

7. A printed circuit board on which is mounted run-length circuitry as defined in claim 1.

8. The printed circuit board defined in claim 7 further comprising:

processing circuitry mounted on the printed circuit board and coupled to the run-length circuitry.

9. The printed circuit board defined in claim 7 further comprising:

a memory mounted on the printed circuit board and coupled to the run-length circuitry.

10. A programmable logic device, comprising:

a deserializer operative to convert a received serial data signal to a parallel data signal and to provide a parallel clock signal; and run-length detection circuitry coupled to receive the parallel data signal and the parallel clock signal, the run-length detection circuitry operative to:

generate a running total of the same consective bits received in the parallel data signal over one or more cycles of the parallel clock signal; and assert a run-length violation signal when the running total exceeds a predetermined number.

11. The programmable logic device of claim 10, further comprising:

utilization circuitry that provides a run-length violation count signal, wherein the run-length detection circuitry receives the run-length count signal and is further operative to:

generate the predetermined number based on the received run-length violation count signal; and compare the running total to the predetermined number to determine whether to assert the run-length violation signal.

12. The programmable logic device of claim 10, further comprising:

utilization circuitry, wherein the run-length detection circuitry is operative to:

provide the run-length violation signal to the utilization cirucitry.

13. The programmable logic device of claim 12, wherein the run-length violation signal is provided asynchronously to the utilization circuitry.

* * * * *